(12) United States Patent
Tazartes et al.

(10) Patent No.: US 6,473,182 B1
(45) Date of Patent: Oct. 29, 2002

(54) AUTOMATIC GAIN CONTROL OF A CLOSED LOOP FIBER OPTIC GYROSCOPE USING NON-LINEAR CONTROL LAWS

(75) Inventors: Daniel A. Tazartes, West Hills, CA (US); James G. Welker, Woodland Hills, CA (US)

(73) Assignee: Northrup Grumman Corporation, Woodland Hills, CA (US)

( * ) Notice: Subject to any disclaimer, the term of this patent is extended or adjusted under 35 U.S.C. 154(b) by 55 days.

(21) Appl. No.: 09/826,763

(22) Filed: Apr. 4, 2001

Related U.S. Application Data

(60) Provisional application No. 60/221,291, filed on Jul. 27, 2000.

(51) Int. Cl.$^7$ ................................................. G01C 19/72
(52) U.S. Cl. ................................... 356/464; 250/214 AG
(58) Field of Search ................................. 356/460, 462, 356/464; 250/214 R, 214 A, 214 LA, 227.11, 214 AG

(56) References Cited

U.S. PATENT DOCUMENTS 5,684,589 A * 11/1997 Mark et al. ................. 356/464
5,883,716 A    3/1999 Mark et al.

* cited by examiner

Primary Examiner—Kevin Pyo
(74) Attorney, Agent, or Firm—Lynn & Lynn

(57) ABSTRACT

A closed loop gain circuit controls the gain of a variable gain amplifier and provides a stable AGC response irrespective of the actual gain level. The amplifier may be arranged to amplify electrical signals output from a fiber optic gyroscope. A perturbation injection circuit provides a perturbation signal ±d to a phase modulator connected to the fiber optic gyro. A perturbation compensation circuit applies perturbation compensation signals to signals output from the variable gain amplifier and produces a compensated signal by reducing the magnitude of the perturbation in the amplified signal output from the variable gain amplifier. A gain error circuit connected to the perturbation compensation circuit produces a gain error signal that indicates the magnitude of the perturbation signal remaining in the amplified signal after perturbation compensation. A feedback system provides a gain control signal to the variable gain amplifier to reduce the magnitude of the gain error signal.

24 Claims, 2 Drawing Sheets

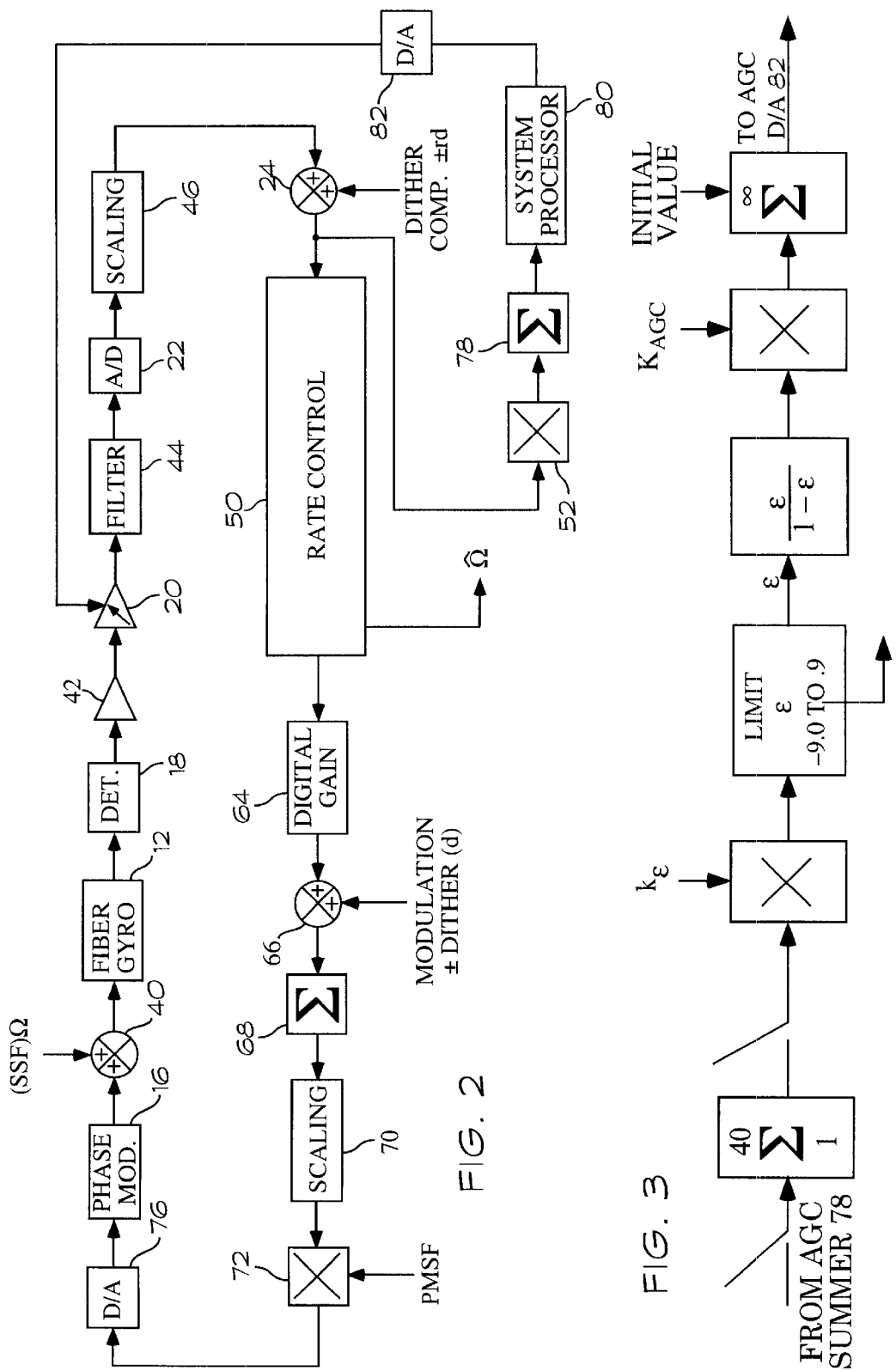

AUTOMATIC GAIN CONTROL OF A CLOSED LOOP FIBER OPTIC GYROSCOPE USING NON-LINEAR CONTROL LAWS

CROSS REFERENCE TO RELATED APPLICATION

Applicants claim the benefit of U.S. Provisional Application Ser. No. 60/221,291, filed Jul. 27, 2000 for Broadband Acoustic Sensor.

BACKGROUND OF THE INVENTION

This invention relates generally to signal processing in fiber optic gyroscope systems. This invention relates particularly to automatic gain control (AGC) circuits in fiber optic gyroscope signal processing systems. Still more particularly, this invention relates to an AGC circuit that achieves a stable response irrespective of the actual gain level.

A closed-loop fiber optic gyroscope requires a high bandwidth, high performance signal processing scheme to capture the differential phase difference induced by the rotation rate. A description of the control loop is contained in U.S. Pat. No. 5,883,716, which issued to Mark and Tazartes on Mar. 16, 1999 and which is assigned to Litton Systems, Inc., assignee of the present invention. The disclosure of U.S. Pat. No. 5,883,716 is incorporated by reference into the present disclosure. In order to achieve the high degree of performance required while accommodating wide variations in loop gain, an active gain control scheme is required. Loop gain variations are due to aging of the light source, variations in optical output or loss over the operating temperature range, and temperature sensitivity of electro-optic components such as photodetectors. In addition, the optical signal can vary by a significant amount from instrument to instrument due to component and manufacturing tolerances.

Automatic gain control loops have therefore been utilized in the past to ensure that the total loop gain remains constant, which is essential to achieving maximum bandwidth and high order loop response. In the past, analog multipliers were used as gain stages in the detection path of the fiber optic gyroscope. While these devices provided an ideal linear control law (i.e. the gain is directly proportional to the applied control voltage), they exhibited a number of undesirable characteristics. These include bandwidth limitations, noise, cost, and linearity as a function of signal level.

For high performance, low noise fiber optic gyroscopes, an alternate gain control block was therefore considered. This is a variable gain amplifier whose gain in dB is proportional to the applied control voltage. In essence, this implies that the gain of the amplifier is an exponential function of applied control voltage as opposed to a linear function as in the earlier embodiments. Such devices are now readily available and offer lower noise and of course, a wider range of gain adjustment without substantial degradation in signal gain linearity. A gain range of 10:1 is easily achievable with such a device.

The desire to adapt such variable gain amplifiers in a fiber optic gyroscope circuit introduced a new problem which this invention addresses. Because of the non-linear gain control law, the time constant or response time of the AGC (automatic gain control) itself could be highly variable, thus limiting its ability to start-up rapidly and to track changes rapidly.

SUMMARY OF THE INVENTION

The present invention overcomes the deficiencies of the prior art by providing a stable AGC response irrespective of the actual gain level.

A closed loop gain control circuit according to the present invention for controlling the gain of a variable gain amplifier that is arranged to amplify electrical signals indicative of optical signal signals output from a fiber optic gyroscope comprises a perturbation injection circuit arranged to provide a perturbation signal ±d. A phase modulator is connected between the perturbation injection circuit and the fiber optic gyro. The phase modulator is arranged to apply the perturbation to the fiber optic gyroscope so that the perturbation signal is superimposed on the gyro output. A variable gain amplifier is arranged to receive the electrical signals indicative of optical signal signals output from the fiber optic gyroscope and provide an amplified signal. A perturbation compensation circuit is arranged to apply perturbation compensation signals to signals output from the variable gain amplifier. The perturbation compensation circuit produces a compensated signal by reducing the magnitude of the perturbation in the amplified signal output from the variable gain amplifier. A gain error circuit is connected to the perturbation compensation circuit. The gain error circuit produces a gain error signal that indicates the magnitude of the perturbation signal remaining in the amplified signal after perturbation compensation. A system processor is connected between the gain error circuit and the variable gain amplifier. The system processor provides a gain control signal to the variable gain amplifier to reduce the magnitude of the gain error signal. Processing circuitry is connected between the perturbation compensation circuit and the phase modulator for determining the rotation rate sensed by the fiber optic gyroscope and for controlling the phase modulator to apply a rate nulling signal to the fiber optic gyroscope.

BRIEF DESCRIPTION OF THE DRAWINGS

FIG. 2 is a block diagram of the primary loop of the fiber optic gyroscope system of FIG. 1; and FIG. 3 is a block diagram of an algorithm that may be included in the present invention.

DETAILED DESCRIPTION OF THE INVENTION

Figure 1:
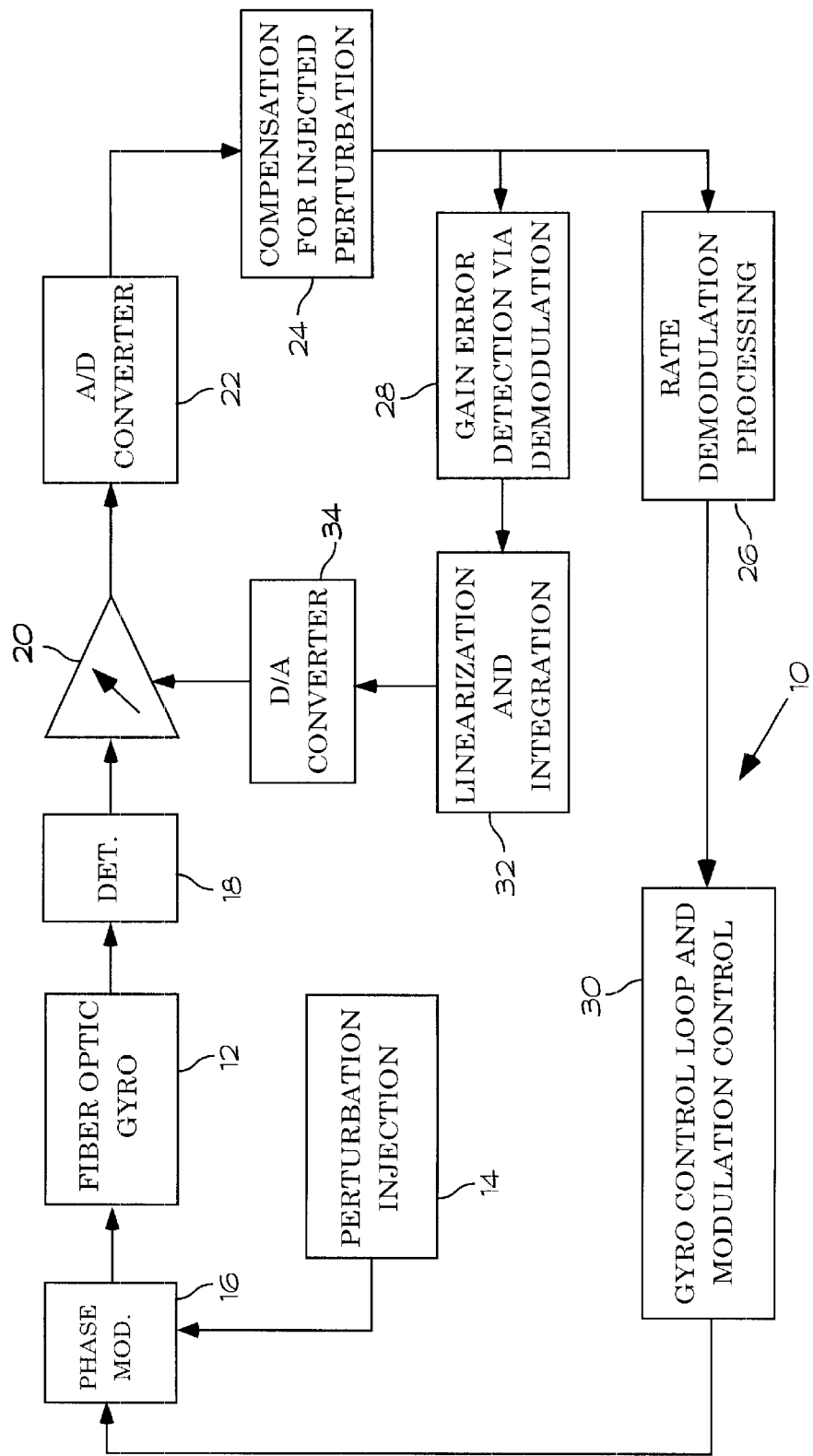
FIG. 1 is a simplified block diagram of a fiber optic gyroscope system that includes automatic gain control circuitry according to the present invention.

Referring to FIG. 1, a fiber optic rotation sensor system 10 includes a fiber optic gyroscope 12 that includes a fiber optic sensing coil (not shown) that detects rotations about a sensing axis perpendicular to the plane of the sensing coil by means of the well-known Sagnac effect. The fiber optic gyroscope 12 produces an optical signal of fluctuating intensity determined by interference between counter-propagating waves in the sensing coil. The interference pattern indicates the rate of rotation of the sensing coil about its sensing axis.

The present invention includes a perturbation injection circuit 14 that provides a perturbation signal to a modulator 16. The modulated perturbation signal is then input from the modulator 16 to the fiber optic gyroscope 12. The modulated perturbation signal is superimposed on the optical signal produced by the fiber optic gyroscope 12 in accordance with the Sagnac effect.

The signal output from the fiber optic gyroscope 12 is incident upon a photodetector 18, which produces an analog electrical signal that indicates the intensity of the optical output from the fiber optic gyroscope 12. The electrical signal from the photodetector 18 is then amplified by a variable gain amplifier 20. The amplified analog signal is input to an analog to digital (A/D) converter 22 that produces a digital signal that is used in further processing of the output of the fiber optic gyroscope 12.

The digital signal output from the A/D converter 22 is input to a compensation circuit 24 that compensates for the injected perturbation. The output of the compensation circuit 24 is input to a rate demodulation processing circuit 26 and to a demodulator 28.

The rate demodulation processing circuit 26 determines the rotation rate. A signal indicative of the rotation rate is output by the rate demodulation processing circuit 26 and input to a gyro control loop and modulation control circuit 30. The fiber optic rotation sensor 10 is arranged in the well-known phase nulling configuration. Accordingly, the gyro control loop and modulation control circuit 30 provides a signal to the modulator 16 that nulls the phase shift in the sensing coil caused by the Sagnac effect.

The demodulator 28 detects errors in the gain of the variable gain amplifier 20. A digital signal that indicates gain errors is input to a linearization and integration circuit 32, which provides the linearized and integrated gain error signal to a digital to analog (D/A) converter 34. The D/A converter 34 then provides the analog gain error signal to the gain control input of the variable gain amplifier 20.

The AGC function is accomplished by injecting a know perturbation ±d in the loop and demodulating the resulting compensated signal with appropriate signs based on the polarity of the compensation.

The variable gain amplifier 20 used in the present invention employs a variable gain element whose gain in dB is proportional to the control voltage. Prior designs used a linear amplifier (not shown). The non-linear characteristic provided by the variable gain amplifier 20 is used advantageously in the gain control loop.

FIG. 2 is a more detailed block diagram of the AGC system according to the present invention. The fiber optic gyro 12 is responsive to the sum of the Sagnac phase shift and the phase shift produced by the modulator 16. A summing junction 40 receives a signal input from the phase modulator 16 and a signal (SSF)Ω that represents the phase shift induced by the angular rate Ω where SSF is the Sagnac scale factor of the fiber gyro 12. The summing junction 40 adds the signal received from the phase modulator 16 by the scale factor to produce a signal that is input to the fiber gyro 12. The fiber gyro 12 uses the Sagnac effect to produce a signal $$\frac{I_0}{2}\sin\phi_M$$

where $\phi_M$ is the phase difference between the modulated counter-propagating waves in the sensing coil. The optical signal output of the fiber gyro 12 is converted to an electrical signal by the photodetector 18. The photodetector 18 has a scale factor $K_{pd}$ which relates the electrical current output from the photodetector 18 to the optical power incident thereon. The photodetector typically has a scale factor $K_{pd}$=0.9 A/W.

The photodetector output is then amplified by a transimpedance amplifier 42 that has a scale factor $K_{TI}$. The transimpedance amplifier 42 is connected between the photodetector 18 and the variable gain amplifier 20 and serves to match the output impedance of the photodetector 18 to the input impedance of the variable gain amplifier 20. The amplified electrical signal output from the variable gain amplifier 20 is input to a filter circuit 44, which has scale factor $k_{filt}$ that is preferably about 0.6.

The signal output from the filter circuit 44 is input to the A/D converter 22, which converts the analog electrical signals into digital signals that are used for processing the fiber gyro output and for AGC of the variable gain amplifier 20. The digital signal output from the D/A converter 22 is input to a scaling circuit 46. The A/D converter 22 and the scaling circuit 46 together have a scale factor $K_A$ that preferably is about 6554 bits/volt.

The output of the scaling circuit 46 is input to a summing junction 24 which also receives an input signal ±rd that is used for dither compensation. Signals output from the summing junction 24 are input to a rate loop control circuit 50 and to an AGC demodulator 52.

The rate loop control circuit 50 may include one or more integrators that operate on the signals. U.S. Pat. No. 5,883, 716, which issued to Mark and Tazartes on Mar. 16, 1999 and assigned to Litton Systems, Inc., assignee of the present invention discloses a rate loop control circuit that may used as the rate loop control circuit in the present invention. The output of the rate loop control circuit 50 is input to a digital gain circuit 64 that applies a gain of $2^s$ to the output of the rate loop controller 50. The output of the digital gain circuit 64 is input to a summing junction 66, which applies the modulation by the dither signal ±d. After the dither is introduced into the circuit, the output of the summing junction 66 is input to a summing circuit 68 that produces a ramp signal output that is input to a scaling circuit 70. The scaling circuit 70 multiplies the ramp signal by $2^{-16}$ and provides an output signal to a multiplier 72 that also receives a signal to indicate the phase modulator scale factor PMSF. Signals output from the multiplier 72 are input to a D/A converter 76, which converts the digital signal input thereto into an analog signal suitable for input to the phase modulator 16.

The dither compensated signal input to the AGC demodulator 52 is demodulated with the appropriate signs based on the polarity of the compensation. The demodulated signal is then input to an integrator 78 which in turn provides an output to a system processor 80. Ideally, if the forward gain of the fiber optic gyroscope signal path is correct, the compensation ±rd will exactly cancel the signal generated by the perturbation, and the demodulated value will be zero. If, however, the gain is in error, a residual signal will survive, which results in a non-zero demodulated value. The sign and magnitude of the demodulated value are indicative of whether the gain is high or low and by how much. The system processor 80 produces a gain control signal to adjust the gain accordingly to bring the residual signal to zero. The gain control signal from the system processor 80 is input to a gain control A/D converter, 82, which, in turn, provides the analog gain control signal to the gain control input of the variable gain amplifier 20.

The following mathematical analysis explains additional details of the method of operation of the AGC function provided by the present invention. The gain characteristic for the amplifier 20 is given by $$G(V)=g_0 10^{\alpha V}, \quad (1)$$

where $\alpha$ is a constant and V is the voltage applied to the gain control input of the amplifier 20.

The gain expressed in dB is written as $$20\log(G(V))=20\log(g_0)+20\alpha V, \quad (2)$$

where $g_0$ is the normalizing gain, and $20\alpha$ is the gain sensitivity in dB/volt.

Alternatively, the gain control law may be rewritten to relate to the binary control word driving the D/A converter 34, which in turn generates the control voltage. Accordingly, the gain is given by $$G(b) = g_0 10^{\beta b} \qquad (3)$$

where $\beta$ is the digital control word written to the D/A converter 34

$$\left(\text{for example } \frac{1}{256}\frac{1}{\text{bit}}\right)$$

and b is the number of bits in the binary control word (for example between 0 and 255 bits).

The gain may also be expressed in dB using the following expression:

$$20 \log(G(b)) = 20 \log(g_0) + 20\beta b, \qquad (4)$$

where $20\beta$ is the gain sensitivity in dB/bit. It should be noted that $\beta/\alpha$ is the AGC DAC scale factor in volts/bit.

Following the loop in FIG. 2 from the point of injection of the perturbation $\pm d$ to the demodulator 28 where the AGC error is detected yields (after demodulation)

$$D = rd - \frac{\pi}{2^{16}}\frac{I_0}{2}\sin\phi_M K_{PD}K_{TI}GK_{FILT}K_A d. \qquad (5)$$

The gain $G_0 = G(b_0)$ that satisfies the overall loop gain is defined by the following relationships:

$$G_L = \frac{\pi}{2^{31}}\frac{I_0}{2}\sin\phi_M K_{PD}K_{TI}G_0 K_{FILT}K_A \cdot 2^S \qquad (6)$$

and $$r = G_L \cdot 2^{-S}. \qquad (7)$$

where $G_L$ is the overall desired loop gain. Thus the following expressions are obtained:

$$D = \left(G_L \cdot 2^{-S} - \frac{G_L}{G_0 \cdot 2^S}G(b)\right)d \qquad (8)$$

and $$D = 2^{-S}G_L\left(1 - \frac{G(b)}{G_0}\right)d. \qquad (9)$$

Define the quantity G(b) as $$G(b) = G_0(1-\epsilon), \qquad (10)$$

where $\epsilon$ is the gain error. Using Eq. (10) in Eq. (9) then gives the result that $$D = 2^{-S}G_L\epsilon d. \qquad (11)$$

In actuality the AGC error signal is summed over many gyro transit times. The gyro transit time is the time interval required for an optical signal to propagate through the length of the sensing coil. The resulting summation is written as:

$$\sum D = \frac{\Delta T}{\tau}2^{-S}G_L\epsilon d \qquad (12)$$

where $\Delta T$ is the integration time and $\tau$ is the transit time. The estimate of the relative gain error is then given by $$\hat{\epsilon} = \frac{\tau}{\Delta T}\frac{2^S}{G_L d}\sum D. \qquad (13)$$

The gain control law is expressed as $$1 - \epsilon = \frac{G(b)}{G_0} = \frac{G(b)}{G(b_0)} = 10^{\beta(b-b_0)} = 10^{\beta\Delta b} \qquad (14)$$

where $\Delta b$ is the error in the gain control D/A converter 34. Taking the natural logarithm of Eq. (14) gives $$\ln(1-\epsilon) = \beta\Delta b \ln(10). \qquad (15)$$

Solving Eq. (15) for $\Delta b$ gives $$\Delta b = \frac{\ln(1-\epsilon)}{\beta\ln(10)}. \qquad (16)$$

Eq. (16) may be differentiated with respect to $\epsilon$ to yield:

$$\frac{\partial \Delta b}{\partial \epsilon} = -\frac{1}{\beta\ln(10)}\frac{1}{1-\epsilon}. \qquad (17)$$

Eq. (17) is used to form the linearized update equation:

$$\Delta b \approx \frac{\partial \Delta b}{\partial \epsilon}\hat{\epsilon} = -\frac{1}{\beta\ln(10)}\frac{\hat{\epsilon}}{1-\epsilon}, \qquad (18)$$

which is rearranged to yield $$b(n-1) = b(n) - \frac{\Delta T}{t_c}\Delta b = b(n) + \frac{\Delta T}{t_c}\frac{1}{\beta\ln(10)}\frac{\hat{\epsilon}}{1-\hat{\epsilon}}, \qquad (19)$$

where $t_c$ is the desired time constant for the AGC loop. In order to ensure stability of the above equations, the value of $\hat{\epsilon}$ should be limited in accordance with the gain range. For a 10 to 1 range, the limits are $-9.0 \leq \hat{\epsilon} \leq 0.9$.

FIG. 3 illustrates an algorithm of signal processing that may be used to control the gain of the amplifier 20. At initialization:

$$\kappa_\epsilon = \frac{\tau}{\Delta T}\frac{2^S}{G_L d} \qquad (20)$$

where $\tau$ is the loop transit time;

$\Delta T$ is the demodulator integration time;

s is the loop controller shift count;

$G_L$ is the primary loop gain (1.0 for deadbeat control, 0.2 for integral control); and d is the dither perturbation value.

$$\kappa_{AGC} = \frac{\Delta T}{t_c}\frac{1}{\beta\ln(10)} \qquad (21)$$

where $t_c$ is the desired AGC loop time constant and $(20)\beta$ is the variable gain amplifier sensitivity in dB/bit.

The gain control command b is set to a value $$b = b_{init} \qquad (22)$$

where $b_{init}$ is the initial gain control D/A converter 34 command to be read from memory. At the integration interval (i.e., every $\Delta T$), $$\epsilon = K_\epsilon \Sigma D \quad (23)$$

where $\Sigma D$ is the demodulator output integrated over the interval $\Delta T$. The limit of the estimated gain error $\epsilon$ is limited to [−9.0, 0.9]. The digital gain control command b supplied to the gain control D/A converter 34 may then be written as $$b = b - \kappa_{AGC} \frac{\varepsilon}{1-\varepsilon}. \quad (24)$$

Nominal values for parameters used in the algorithm are given in the following table.

| | |
|---|---|
| $\tau$ | 5.4 $\mu$s |
| $\Delta T$ | 500 $\mu$sec–1 sec |
| s | 5 to 16 |
| $G_L$ | 0.1–1.0 |
| d | $2^{16}$ to $2^{28}$ |
| $t_c$ | 1.0 msec–30 sec |
| 20$\beta$ | $20\beta = \frac{20}{256}$ dB/bit |
| $\beta$ | $\beta = \frac{1}{256}$ |

What is claimed is:

1. A closed loop gain control circuit for controlling the gain of a non-linear variable gain amplifier that is arranged to amplify signals output from a signal source, comprising:
   a perturbation source arranged to provide dither signals of magnitude ±d;
   a modulator connected between the perturbation source and the signal source;
   a dither compensation circuit connected to the amplifier and arranged to apply dither compensation signals having magnitude ±rd to signals output from the amplifier, the dither compensation signals being formed to reduce the magnitude of the dither in the signals output from the amplifier;
   a gain error demodulator connected to receive signals output from the dither compensation circuit, the gain error demodulator being arranged to provide a gain error signal that indicates the magnitude of the dither in the signals output from the analog to digital converter; and
   a feedback system connected to the gain control demodulator and arranged to provide a gain control signal to the variable gain amplifier to reduce the magnitude of the gain error signal.

2. The closed loop gain control circuit of claim 1, further comprising:
   an analog to digital converter connected to receive the amplified signal output from the variable gain amplifier; and
   a summing junction arranged to receive a first signal input from the analog to digital converter and a second signal input ±rd that compensates for the perturbation.

3. The closed loop gain control circuit of claim 1 wherein the feedback loop includes:
   a linearization and integration circuit arranged to receive signals output from the gain error demodulator; and
   a digital to analog converter connected between the variable gain amplifier and the linearization and integration circuit.

4. A closed loop gain control circuit for controlling the gain of a non-linear variable gain amplifier that is arranged to amplify signals output from a signal source, comprising:
   a perturbation injection circuit arranged to provide a perturbation signal ±d;
   a phase modulator connected between the perturbation injection circuit and the signal source to phase modulate signals output from the signal source;
   a variable gain amplifier arranged to receive the electrical signals indicative of optical signal signals output from the signal source and provide an amplified signal;
   a perturbation compensation circuit arranged to apply perturbation compensation signals to signals output from the variable gain amplifier, the perturbation compensation circuit being arranged to provide a compensated signal by reducing the magnitude of the perturbation in the amplified signal output from the variable gain amplifier;
   a gain error circuit connected to the perturbation compensation circuit, the gain error circuit being arranged to produce a gain error signal that indicates the magnitude of perturbation remaining in the amplified signal after perturbation compensation; and
   a feedback system connected between the gain error circuit and the variable gain amplifier, the feedback system being arranged to provide a gain control signal to the variable gain amplifier to reduce the magnitude of the gain error signal.

5. The apparatus of claim 4 wherein the perturbation compensation circuit includes:
   an analog to digital converter connected to receive the amplified signal output from the variable gain amplifier; and
   a summing junction arranged to receive a first signal input from the analog to digital converter and a second signal input ±rd that compensates for the perturbation.

6. The apparatus of claim 4 wherein the gain error circuit includes a gain error demodulator connected to the summing junction and arranged to produce the gain error signal by demodulating the compensated signal.

7. The apparatus of claim 6 wherein the gain error circuit further includes:
   an integrator connected to receive signals output from the gain error demodulator; and
   a digital to analog converter connected between the variable gain amplifier and the integrator.

8. A system for processing optical signal signals output from a fiber optic gyroscope, comprising:
   a perturbation injection circuit arranged to provide a perturbation signal ±d;
   a phase modulator connected between the perturbation injection circuit and the fiber optic gyro, the phase modulator being arranged to apply the perturbation to the fiber optic gyroscope;
   a variable gain amplifier arranged to receive the electrical signals indicative of optical signal signals output from the fiber optic gyroscope and provide an amplified signal;
   a perturbation compensation circuit arranged to apply perturbation compensation signals to signals output from the variable gain amplifier, the perturbation compensation circuit being arranged to provide a compensated signal by reducing the magnitude of the perturbation in the amplified signal output from the variable gain amplifier;

a gain error circuit connected to the perturbation compensation circuit, the gain error circuit being arranged to produce a gain error signal that indicates the magnitude of perturbation remaining in the amplified signal after perturbation compensation;

a feedback system connected between the gain error circuit and the variable gain amplifier, the feedback system being arranged to provide a gain control signal to the variable gain amplifier to reduce the magnitude of the gain error signal; and processing circuitry connected between the perturbation compensation circuit and the phase modulator for determining the rotation rate sensed by the fiber optic gyroscope and for controlling the phase modulator to apply a rate nulling signal to the fiber optic gyroscope.

9. The apparatus of claim 8 wherein the perturbation compensation circuit includes:

an analog to digital converter connected to receive the amplified signal output from the variable gain amplifier; and a summing junction arranged to receive a first signal input from the analog to digital converter and a second signal input ±rd that compensates for the perturbation.

10. The apparatus of claim 8 wherein the gain error circuit includes a gain error demodulator connected to the summing junction and arranged to produce the gain error signal by demodulating the compensated signal.

11. The apparatus of claim 10 wherein the gain error circuit further includes an integrator connected to receive signals output from the gain error demodulator.

12. The apparatus of claim 11, further including a digital to analog converter connected between the integrator and the variable gain amplifier.

13. A method for controlling the gain of a non-linear variable gain amplifier that is arranged to amplify signals output from a signal source, comprising the steps of:

arranging a perturbation source to provide dither signals of magnitude ±d;

connecting a modulator between the perturbation source and the signal source;

connecting a dither compensation circuit to the amplifier;

arranging the dither compensation circuit to apply dither compensation signals having magnitude ±rd to signals output from the amplifier, the dither compensation signals being formed to reduce the magnitude of the dither in the signals output from the amplifier;

connecting a gain error demodulator to receive signals output from the dither compensation circuit, the gain error demodulator being arranged to provide a gain error signal that indicates the magnitude of the dither in the signals output from the analog to digital converter; and connecting a feedback system to the gain control demodulator and arranged to provide a gain control signal to the variable gain amplifier to reduce the magnitude of the gain error signal.

14. The method of claim 13, further comprising the steps of:

connecting an analog to digital converter to receive the amplified signal output from the variable gain amplifier; and arranging a summing junction to receive a first signal input from the analog to digital converter and a second signal input ±rd that compensates for the perturbation.

15. The method of claim 13, including the steps of:

arranging a linearization and integration circuit to receive signals output from the gain error demodulator; and connecting a digital to analog converter between the variable gain amplifier and the linearization and integration circuit.

16. A method for controlling the gain of a non-linear variable gain amplifier that is arranged to amplify signals output from a signal source, comprising the steps of:

arranging a perturbation injection circuit to provide a perturbation signal ±d;

connecting a phase modulator between the perturbation injection circuit and the signal source to phase modulate signals output from the signal source;

arranging a variable gain amplifier to receive the electrical signals indicative of optical signal signals output from the signal source and provide an amplified signal;

arranging a perturbation compensation circuit to apply perturbation compensation signals to signals output from the variable gain amplifier, the perturbation compensation circuit being arranged to provide a compensated signal by reducing the magnitude of the perturbation in the amplified signal output from the variable gain amplifier;

connecting a gain error circuit to the perturbation compensation circuit, the gain error circuit being arranged to produce a gain error signal that indicates the magnitude of perturbation remaining in the amplified signal after perturbation compensation; and connecting a feedback system between the gain error circuit and the variable gain amplifier, the feedback system being arranged to provide a gain control signal to the variable gain amplifier to reduce the magnitude of the gain error signal.

17. The method of claim 16, further including the steps of:

connecting an analog to digital converter to receive the amplified signal output from the variable gain amplifier; and arranging a summing junction to receive a first signal input from the analog to digital converter and a second signal input ±rd that compensates for the perturbation.

18. The method of claim 16, further including the steps of:

forming the gain error circuit to include a gain error demodulator connected to the summing junction; and arranging the gain error circuit to produce the gain error signal by demodulating the compensated signal.

19. The method of claim 18, further including the steps of:

connecting an integrator to receive signals output from the gain error demodulator; and connecting a digital to analog converter between the variable gain amplifier and the integrator.

20. A method for processing optical signal signals output from a fiber optic gyroscope, comprising the steps of:

arranging a perturbation injection circuit to provide a perturbation signal ±d;

connecting a phase modulator between the perturbation injection circuit and the fiber optic gyro, the phase modulator being arranged to apply the perturbation to the fiber optic gyroscope;

arranging a variable gain amplifier to receive the electrical signals indicative of optical signal signals output from the fiber optic gyroscope and provide an amplified signal;

arranging a perturbation compensation circuit to apply perturbation compensation signals to signals output from the variable gain amplifier, the perturbation compensation circuit being arranged to provide a compensated signal by reducing the magnitude of the perturbation in the amplified signal output from the variable gain amplifier;

connecting a gain error circuit to the perturbation compensation circuit, the gain error circuit being arranged to produce a gain error signal that indicates the magnitude of perturbation remaining in the amplified signal after perturbation compensation;

connecting a feedback system between the gain error circuit and the variable gain amplifier, the feedback system being arranged to provide a gain control signal to the variable gain amplifier to reduce the magnitude of the gain error signal; and connecting processing circuitry between the perturbation compensation circuit and the phase modulator for determining the rotation rate sensed by the fiber optic gyroscope and for controlling the phase modulator to apply a rate nulling signal to the fiber optic gyroscope.

21. The method of claim 20, further including the steps of:

connecting an analog to digital converter to receive the amplified signal output from the variable gain amplifier; and arranging a summing junction to receive a first signal input from the analog to digital converter and a second signal input ±rd that compensates for the perturbation.

22. The apparatus method of claim 20, further including the steps of:

connecting a gain error demodulator connected to the summing junction; and arranging the gain error demodulator to produce the gain error signal by demodulating the compensated signal.

23. The method of claim 22, further including the step of connecting an integrator to receive signals output from the gain error demodulator.

24. The apparatus of claim 23, further including the step of connecting a digital to analog converter between the integrator and the variable gain amplifier.

* * * * *